United States Patent
Na et al.

(10) Patent No.: US 8,748,251 B2
(45) Date of Patent: Jun. 10, 2014

(54) METHODS FOR MANUFACTURING SEMICONDUCTOR DEVICES USING ETCH STOP DIELECTRIC LAYERS AND RELATED DEVICES

(75) Inventors: Hoon-Joo Na, Hwaseong-si (KR); Hyung-Seok Hong, Ansan-si (KR); Sang-Bom Kang, Seoul (KR); Hyeok-Jun Son, Seoul (KR); June-Hee Lee, Hwaseong-si (KR); Jeong-Hee Han, Hwaseong-si (KR); Sang-Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 163 days.

(21) Appl. No.: 13/528,068

(22) Filed: Jun. 20, 2012

(65) Prior Publication Data

US 2012/0329262 A1    Dec. 27, 2012

(30) Foreign Application Priority Data

Jun. 22, 2011    (KR) .................. 10-2011-0060773

(51) Int. Cl.
*H01L 21/8238*    (2006.01)
*H01L 21/8234*    (2006.01)

(52) U.S. Cl.
CPC . *H01L 21/823842* (2013.01); *H01L 21/823828* (2013.01); *H01L 21/82345* (2013.01)
USPC .................. 438/230; 438/287; 438/299

(58) Field of Classification Search
CPC .............. H01L 21/823842; H01L 21/823828; H01L 21/82345
USPC .......................................... 438/230, 287, 299
See application file for complete search history.

(56) References Cited

U.S. PATENT DOCUMENTS

| | | | |
|---|---|---|---|
| 2005/0233527 A1* | 10/2005 | Brask et al. | 438/287 |
| 2006/0001106 A1* | 1/2006 | Metz et al. | 257/369 |
| 2009/0042405 A1* | 2/2009 | Doczy et al. | 438/785 |
| 2011/0115028 A1* | 5/2011 | Datta et al. | 257/369 |

FOREIGN PATENT DOCUMENTS

| | | |
|---|---|---|
| JP | 2007-214436 | 8/2007 |
| JP | 2009-033032 | 2/2009 |
| JP | 2011-035229 | 2/2011 |

* cited by examiner

*Primary Examiner* — Kimberly D. Nguyen
*Assistant Examiner* — Maria Ligai
(74) *Attorney, Agent, or Firm* — Myers Bigel Sibley & Sajovec, P.A.

(57) ABSTRACT

A method for manufacturing a semiconductor may include providing a substrate having first and second regions defined therein, forming an interlayer dielectric layer including first and second trenches formed in the first and second regions, respectively, and conformally forming a gate dielectric layer along a top surface of the interlayer dielectric layer, side and bottom surfaces of the first trench and side, and bottom surfaces of the second trench. An etch stop dielectric layer may be formed on the gate dielectric layer, a first metal layer may be formed to fill the first and second trenches, and the first metal layer in the first region may be removed using the etch stop dielectric layer as an etch stopper.

14 Claims, 12 Drawing Sheets

METHODS FOR MANUFACTURING SEMICONDUCTOR DEVICES USING ETCH STOP DIELECTRIC LAYERS AND RELATED DEVICES

CROSS-REFERENCE TO RELATED APPLICATION

This application claims priority from Korean Patent Application No. 10-2011-0060773 filed on Jun. 22, 2011, in the Korean Intellectual Property Office, and all the benefits accruing therefrom under 35 U.S.C. 119. The disclosure of the above referenced application is hereby incorporated herein in its entirety by reference.

BACKGROUND

1. Field of Inventive Concepts

Present inventive concepts relate to methods for manufacturing semiconductor devices.

2. Description of Related Art

A replacement metal gate (RMG) process may be used in semiconductor device fabrication. For example, a semiconductor device may be manufactured by depositing a high-k metal gate (HKMG) stack in a trench formed by removing a sacrificial gate.

In order to obtain a satisfactory threshold voltage (Vt) in manufacturing a CMOS device, a PMOS gate and an NMOS gate can be formed using two different work function materials. Specifically, the work function of the PMOS gate should be higher than that of the NMOS gate.

For example, a PMOS gate and an NMOS gate may be formed using first and second metal layers having different work functions. In order to form the PMOS gate and the NMOS gate using different metals, a first metal layer is deposited in a PMOS region and an NMOS region, the first metal layer in the NMOS region is removed, and the second metal layer is deposited on the NMOS region. However, in order to prevent/reduce over etch in the course of removing the first metal layer, it may be necessary/useful to attain a sufficiently large etch margin.

SUMMARY

Present inventive concepts may provide a method for manufacturing a semiconductor device using an etch stop dielectric layer. A sufficiently large etch margin may be provided using an etch stop dielectric layer as an etch stopper.

The above and/or other objects of present inventive concepts will be described in or be apparent from the following description of embodiments.

According to some embodiments of present inventive concepts, a method for manufacturing a semiconductor device may include: providing a substrate having first and second regions defined therein; forming an interlayer dielectric layer including first and second trenches formed in the first and second regions, respectively; conformally forming a gate dielectric layer along a top surface of the interlayer dielectric layer, side and bottom surfaces of the first trench and side and bottom surfaces of the second trench; forming an etch stop dielectric layer on the gate dielectric layer; forming a first metal layer to fill the first and second trenches; and removing the first metal layer in the first region using the etch stop dielectric layer as an etch stopper.

According to other embodiments of present inventive concepts, a method for manufacturing a semiconductor device may include: forming first and second sacrificial gates in first and second regions of a substrate; forming an interlayer dielectric layer to cover the first and second sacrificial gates; exposing top surfaces of the first and second sacrificial gates by planarizing the interlayer dielectric layer; forming first and second trenches in the first and second regions by removing the first and second sacrificial gates; conformally forming a gate dielectric layer containing a high-k dielectric material along a top surface of the interlayer dielectric layer, side and bottom surfaces of the first trench and side and bottom surfaces of the second trench; forming a metal capping layer on the gate dielectric layer; forming an etch stop dielectric layer including at least one selected from the group consisting of metal oxide, metal oxynitride, metal silicon oxide, and metal silicon oxynitride on the metal capping layer; forming a first metal layer to fill the first and second trenches; and removing the first metal layer in the first region using the etch stop dielectric layer as an etch stopper.

According to still other embodiments of present inventive concepts, a method for manufacturing a semiconductor device may include providing a substrate having first and second regions, and forming an interlayer dielectric layer on the substrate, with the interlayer dielectric layer including a first trench on the first region of the substrate and a second trench on the second region of the substrate. A gate dielectric layer may be formed on a surface of the interlayer dielectric layer, on side and bottom surfaces of the first trench, and on side and bottom surfaces of the second trench. An etch stop dielectric layer may be formed on the gate dielectric layer, with the gate dielectric layer and the etch stop dielectric layer comprising different materials. A metal layer may be formed on the etch stop dielectric layer filling the first and second trenches, and the metal layer may be in the first region including the first trench and may be removed using the etch stop dielectric layer as an etch stop.

According to yet other embodiments of present inventive concepts, a semiconductor device may include a semiconductor substrate and an interlayer dielectric layer on the substrate, with the interlayer dielectric layer including first and second trenches spaced apart on the substrate. A first gate dielectric layer may be provided on sidewall and bottom surfaces of the first trench, and a second gate dielectric layer may be provided on sidewall and bottom surfaces of the second trench. An etch stop dielectric layer may be provided on the second gate dielectric layer in the second trench, with the etch stop dielectric layer and the second gate dielectric layer comprising different materials. A first metal gate layer may be provided on the first gate dielectric layer in the first trench, and a second metal gate layer may be provided on the etch stop dielectric layer in the second trench, with the first and second metal gate layers having different work functions.

BRIEF DESCRIPTION OF THE DRAWINGS

The above and other features and advantages of present inventive concepts will become more apparent by describing in detail embodiments thereof with reference to the attached drawings in which.

DETAILED DESCRIPTION OF EMBODIMENTS

Figure 1:
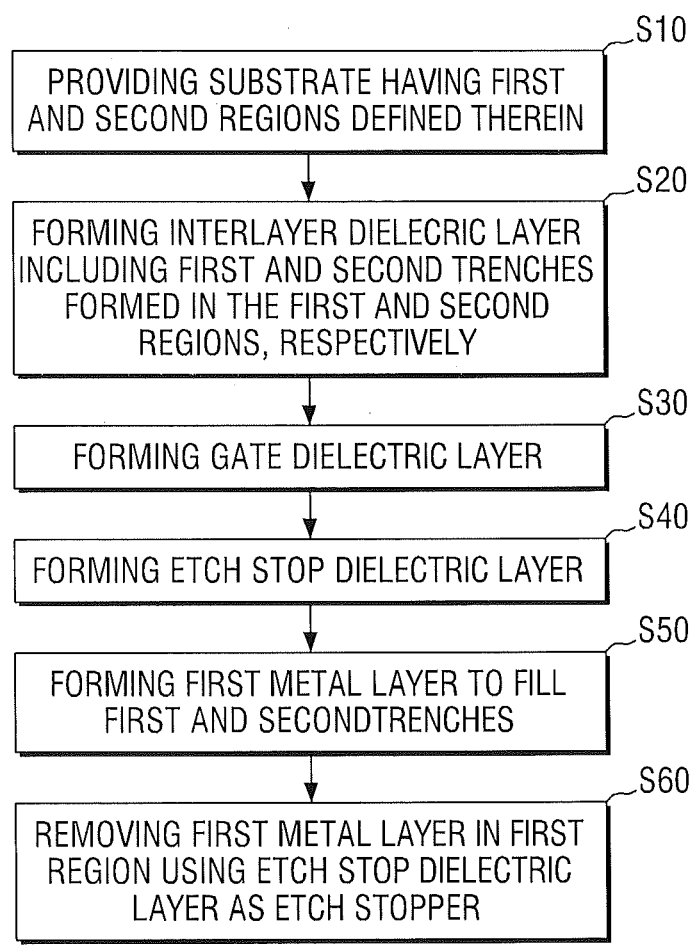
FIG. 1 is a flow chart illustrating a method for manufacturing a semiconductor device according to some embodiments of present inventive concepts.

Advantages and features of present inventive concepts and methods of accomplishing the same may be understood more readily by reference to the following detailed description of embodiments and the accompanying drawings. Present inventive concepts may, however, be embodied in many different forms and should not be construed as being limited to the embodiments set forth herein. Rather, these embodiments are provided so that this disclosure will be thorough and complete and will fully convey the concepts of the invention to those skilled in the art, and the present invention will only be defined by the appended claims. In the drawings, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of present inventive concepts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A method for manufacturing a semiconductor device according to some embodiments of present inventive concepts will now be described with reference to FIGS. 1 to 10. FIG. 1 is a flow chart illustrating operations of a method for manufacturing a semiconductor device according to some embodiments of present inventive concepts, and FIGS. 2 to 10 are cross-sectional views of intermediate structures of methods for manufacturing a semiconductor device according to some embodiments of present inventive concepts.

For brevity, source/drain regions and a device isolation region such as a shallow trench isolation (STI) region formed in a substrate are not illustrated in FIGS. 2 to 10.

Figure 2:
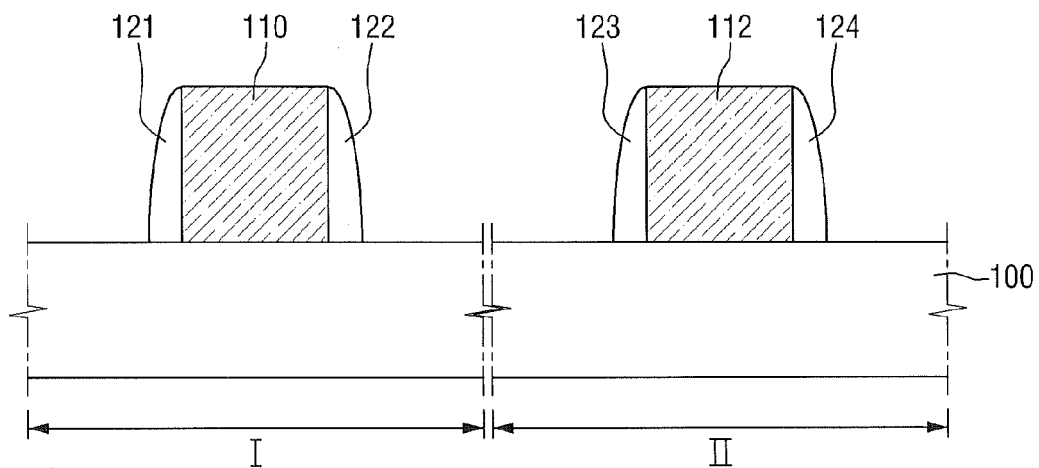
FIGS. 2 to 10 are cross-sectional views of intermediate structures of methods for manufacturing a semiconductor device according to some embodiments of present inventive concepts.

Referring first to FIGS. 1 and 2, a substrate 100 having first and second regions I and II defined therein is provided (S10).

In greater detail, the substrate 100 having first and second regions I and II defined therein may be provided, and first and second sacrificial gates 110 and 112 may be formed on the first and second regions I and II, respectively. First and second spacers 121 and 122 may be formed on opposite sides of the first sacrificial gate 110 and third and fourth spacers 123 and 124 may be formed on opposite sides of the second sacrificial gate 112.

The first region I may be one of the PMOS region and the NMOS region, and the second region II may be one of the PMOS region and the NMOS region, which is different from the first region I. For example, the first region I may be a PMOS region and the second region II may be an NMOS region, and vice versa.

The substrate 100 may be a silicon bulk substrate or a silicon-on-insulator (SOI) substrate. Alternatively, the substrate 100 may be a silicon substrate, or a substrate made of another material, for example, Germanium (Ge), indium antimonide, lead telluride, indium arsenide, indium phosphide, gallium arsenide and/or gallium antimonide. The substitute, however, is not limited to the above identified materials.

The first and second sacrificial gates 110 and 112 may be made of a semiconductor material, for example, polysilicon, but the sacrificial gates are not limited thereto. The first to fourth spacers 121, 122, 123 and 124 may be made of, for example, silicon oxide, but the spaces are not limited to silicon oxide.

Figure 3:
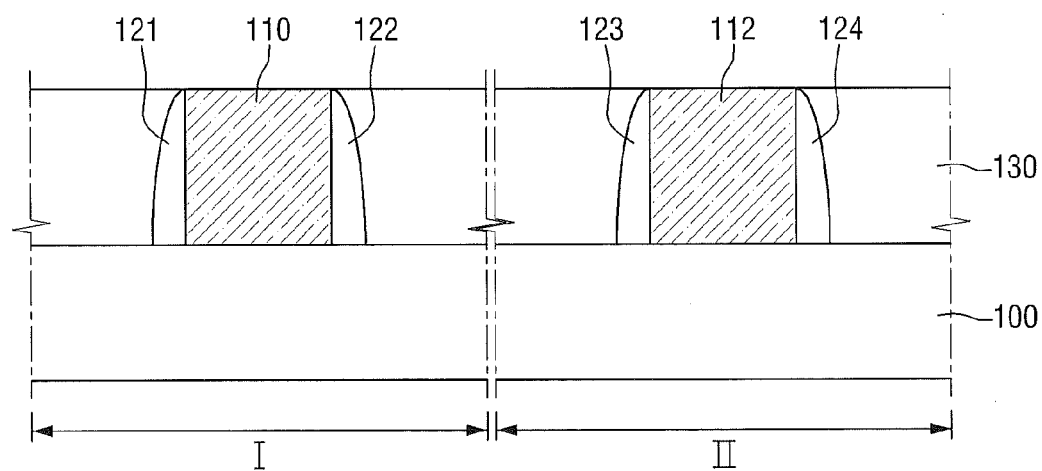
Figure 4:
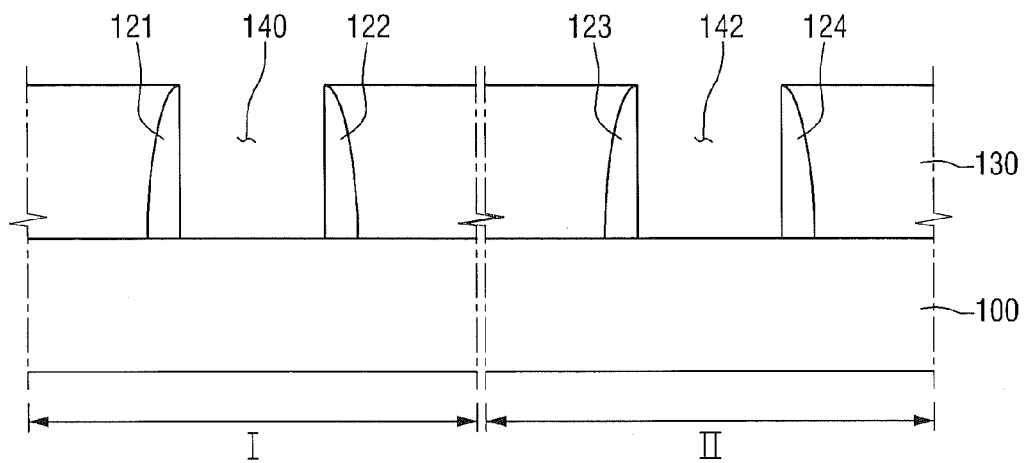

Next, referring to FIGS. 1, 3 and 4, an interlayer dielectric layer 130 including first and second trenches 140 and 142 is formed in the first and second regions I and II (S20).

Specifically, referring to FIG. 3, the interlayer dielectric layer 130 is formed to cover the first and second sacrificial gates 110 and 112, and the interlayer dielectric layer 130 is planarized to expose top surfaces of the first and second sacrificial gates 110 and 112. For example, the interlayer dielectric layer 130 may be planarized using a chemical mechanical polishing (CMP) process.

Referring to FIG. 4, the first and second sacrificial gates (110 and 112 of FIG. 3) are removed to form the first and second trenches 140 and 142 in the first and second regions I and II, respectively.

The interlayer dielectric layer 130 may be made of, for example, silicon oxide, but the interlayer dielectric layer is not limited to silicon oxide.

Figure 5:
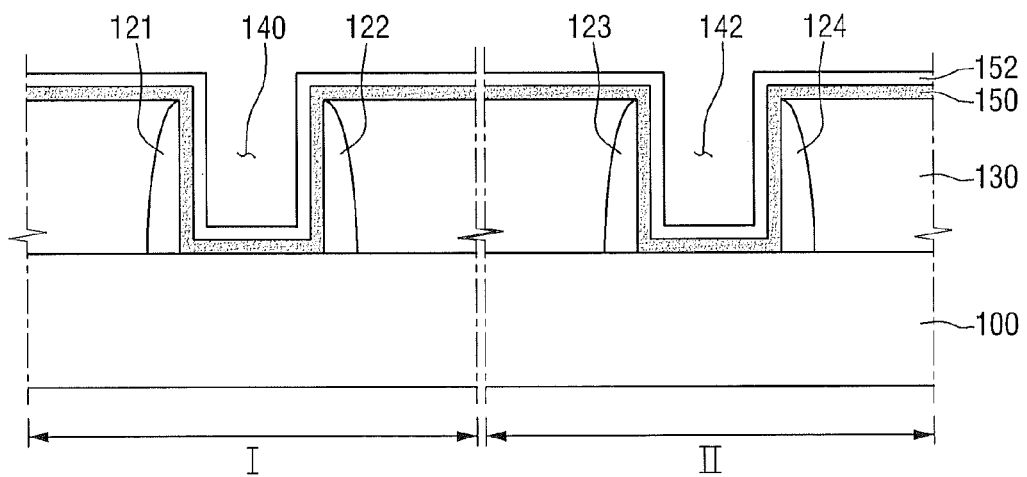

Next, referring to FIGS. 1 and 5, a gate dielectric layer 150 is conformally formed along a top surface of the interlayer dielectric layer 130, side and bottom surfaces of the first trench 140 and side and bottom surfaces of the second trench 142 (S30).

Since the gate dielectric layer 150 is formed on side surfaces of the first and second trenches 140 and 142, the gate dielectric layer 150 may be brought into contact with the first to fourth spacers 121, 122, 123 and 124.

The gate dielectric layer 150 may include a high-k dielectric material. Examples of the high-k dielectric material may include, but are not limited to, at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

A metal capping layer 152 may be formed on the gate dielectric layer 150. The metal capping layer 152 prevents/reduces exposure of the gate dielectric layer 150 to an outside environment while a semiconductor manufacturing process is performed, thereby protecting the gate dielectric layer 150. The metal capping layer 152 may include, for example, a metal material, but the metal cupping layer is not limited to a metal material.

Figure 6:
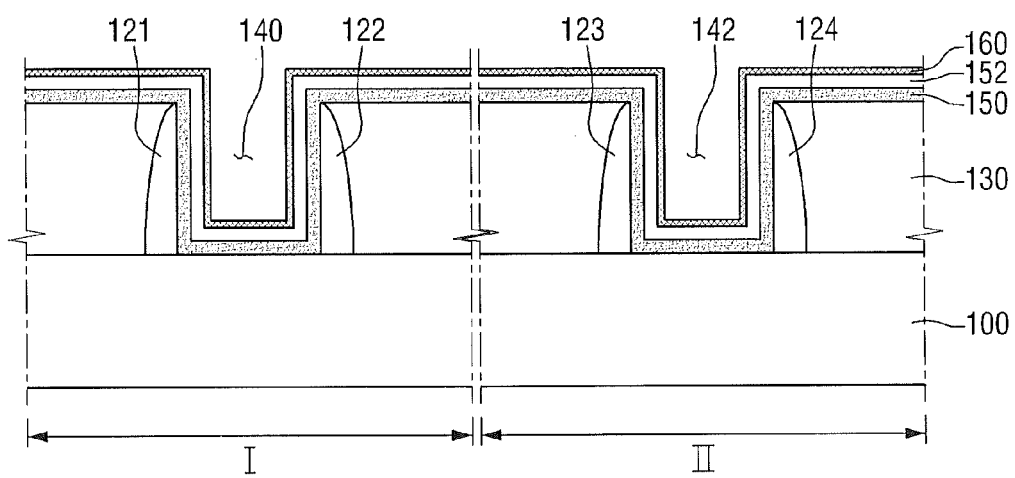

Next, referring to FIGS. 1 and 6, an etch stop dielectric layer 160 is formed on the gate dielectric layer 150 (S40). The metal capping layer 152 may be positioned between the gate dielectric layer 150 and the etch stop dielectric layer 160. The etch stop dielectric layer 160 may include at least one of metal oxide, metal oxynitride, metal silicon oxide, and/or metal silicon oxynitride.

The etch stop dielectric layer 160 may be formed by depositing at least one of metal oxide, metal oxynitride, metal silicon oxide, and/or metal silicon oxynitride, on the metal capping layer 152. The etch stop dielectric layer 160 may also be formed by oxidizing the metal capping layer 152. For example, the metal capping layer 152 may be partially oxidized to form the etch stop dielectric layer 160, but formation of the etch stop dielectric layer is not limited to oxidation.

The etch stop dielectric layer 160 may be used as an etch stopper in a subsequent etching process.

Figure 7:
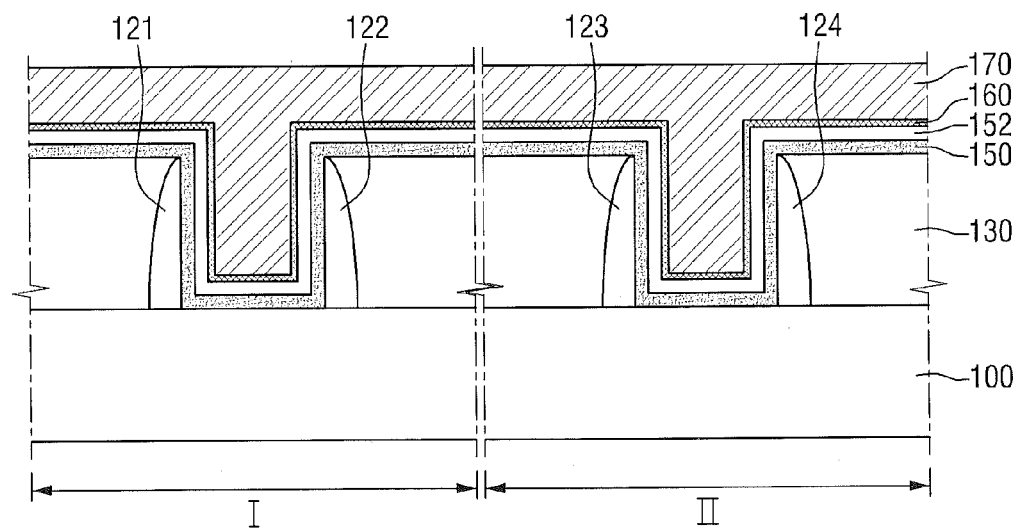

Referring to FIGS. 1 and 7, a first metal layer 170 is formed to fill first and second trenches (140 and 142 of FIG. 6) (S50).

If the first region I is a PMOS region and the second region II is an NMOS region, the first metal layer 170 may include a material having a smaller work function than a second metal layer (190 of FIG. 9) to be described later. On the contrary, if the first region I is an NMOS region and the second region II is a PMOS region, the first metal layer 170 may include a material having a larger work function than the second metal layer (190 of FIG. 9).

Figure 8:
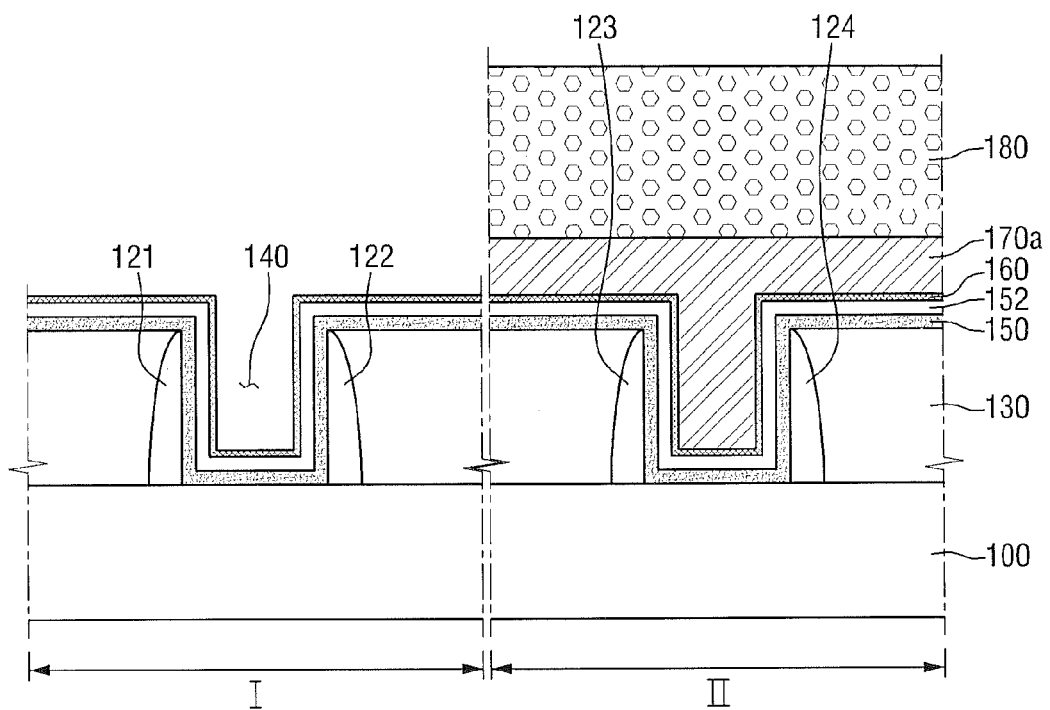

Referring to FIGS. 1 and 8, a first metal layer (170 of FIG. 7) in the first region I is removed using the etch stop dielectric layer 160 as an etch stopper (S60).

In detail, a mask layer 180 may be formed on the first metal layer 170 in the second region II. In addition, the first metal layer 170 in the first region I is removed using the etch stop dielectric layer 160 as an etch stopper. While the first metal layer 170 in the first region I is etched, the first metal layer 170 in the second region II can be protected by the mask layer 180.

As a result of the process shown in FIG. 8, the first metal layer 170 in the first region I is removed to re-expose the first trench 140, while the first metal layer 170 in the second region II protected by the mask layer 180 remains to form a first metal layer pattern 170a.

In order to remove the first metal layer 170 in the first region I, an etchant is selected having larger etch selectivity with respect to the first metal layer 170 than the etch stop dielectric layer 160 including at least one of metal oxide, metal oxynitride, metal silicon oxide, and metal silicon oxynitride. Since there is a large difference in etch selectivity between the etch stop dielectric layer 160 and the first metal layer 170, the use of the etchant allows only an insignificant amount of the etch stop dielectric layer 160 to be etched while the first metal layer 170 is removed. That is to say, the use of the etch stop dielectric layer 160 as an etch stopper may provide for a sufficient etch margin. Thus, the first metal layer 170 in the first region I can be completely removed even if over-etch is not performed.

Since the first metal layer 170 in the first region I has been completely removed in the process shown in FIG. 8, the first region I is not affected by the first metal layer 170. Thus, a metal gate having desired properties can be formed in the first region I by depositing a material different from the first metal layer 170 on the first region I in a subsequent process.

Figure 9:
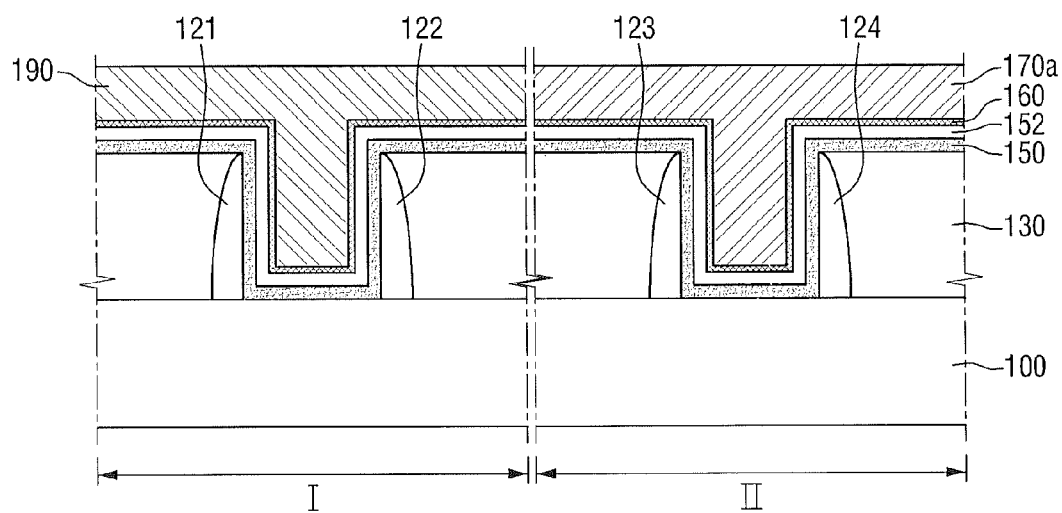

Next, referring to FIG. 9, a second metal layer 190 may be formed to fill the first trench (140 of FIG. 8). In detail, the mask layer (180 of FIG. 8) may be removed, the second metal layer 190 may be formed on the first region I, and the first metal layer pattern 170a may be formed on the second region II. For example, a layer of the second metal may be formed on the first region I (including trench 140) and on the second region II (including metal layer 170a), and the layer of the second metal may be selectively removed from the second region II.

In order to attain a desired threshold voltage (Vt) in manufacturing a CMOS device, a PMOS gate and an NMOS gate may be formed using materials having different work functions. In detail, a material of the PMOS gate may have a larger work function than a material of the NMOS gate.

Figure 10:
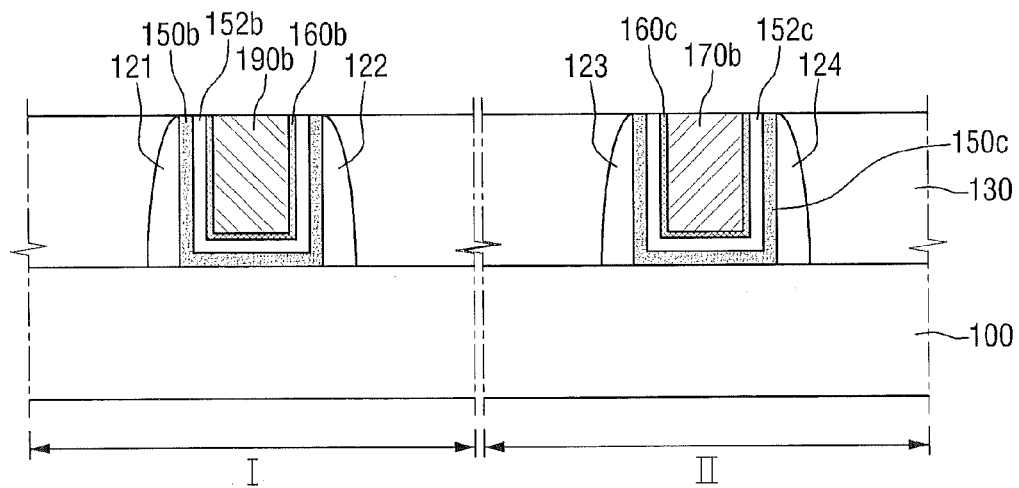

The second metal layer 190 on the first region I is patterned to form a first metal gate (190b of FIG. 10), and the first metal layer pattern 170a on the second region II is patterned to form a second metal gate (170b of FIG. 10). The second metal layer 190 and the first metal layer pattern 170a may be made of different materials. For example, the first metal layer pattern 170a and the second metal layer 190 may have different work functions from each other. In detail, if the first region I is a PMOS region and the second region II is an NMOS region, the second metal layer 190 may include a material having a larger work function than the first metal layer pattern 170a. On the contrary, if the first region I is an NMOS region and the second region II is a PMOS region, the second metal layer 190 may include a material having a larger work function than the first metal layer pattern 170a.

Since the first metal layer (170 of FIG. 8) in the first region I has been completely removed in the process shown in FIG. 8, the first region I is affected by the second metal layer 190 and the second region II is affected by the first metal layer pattern 170a. Thus, a semiconductor device including gates in the first and second regions I and II having different work functions can be manufactured.

Referring to FIG. 10, a top surface of the interlayer dielectric layer 130 may be exposed by planarizing the first metal layer pattern (170a of FIG. 9), the second metal layer (190 of FIG. 9), the gate dielectric layer (150 of FIG. 9), the metal capping layer 152 of FIG. 9) and the etch stop dielectric layer (160 of FIG. 9).

A portion of the second metal layer 190 may be removed to form a first metal gate 190b and a portion of the first metal layer pattern 170a may be removed to form a second metal gate 170b. The gate dielectric layer 150 may be patterned to form first and second gate dielectric layer patterns 150b and 150c in the first and second regions I and II, respectively. In addition, the metal capping layer 152 may be patterned to form first and second metal capping layer patterns 152b and 152c in the first and second regions I and II, respectively. In addition, the etch stop dielectric layer 160 may be patterned to form first and second etch stop dielectric layer patterns 160b and 160c in the first and second regions I and II, respectively.

Consequently, a semiconductor device manufactured by the manufacturing method discussed above with respect to FIGS. 1-10 includes a substrate 100 having the first and second regions I and II defined therein. The first and second spacers 121 and 122 are formed separated from each other on the first region I. A first gate dielectric layer pattern 150b, a first metal capping layer pattern 152b and a first etch stop dielectric layer pattern 160b (which are positioned between the first and second spacers 121 and 122 and sequentially formed along sidewalls of the first and second spacers 121 and 122 and a top surface of the substrate 100) are formed on the first region I. A first metal gate 190b is formed on the first etch stop dielectric layer pattern 160b on the first region I. Third and fourth spacers 123 and 124 are formed separated from each other on the second region II. A second gate dielectric layer pattern 150c, a second metal capping layer patter 152c and a second etch stop dielectric layer pattern 160c (which are positioned between the third and fourth spacers 123 and 124 and sequentially formed along sidewalls of the third and fourth spacers 123 and 124 and the top surface of the substrate 100) are formed on the second region II, A second metal gate 170b is formed on the second etch stop dielectric layer pattern 160c on the second region II.

Figure 11:
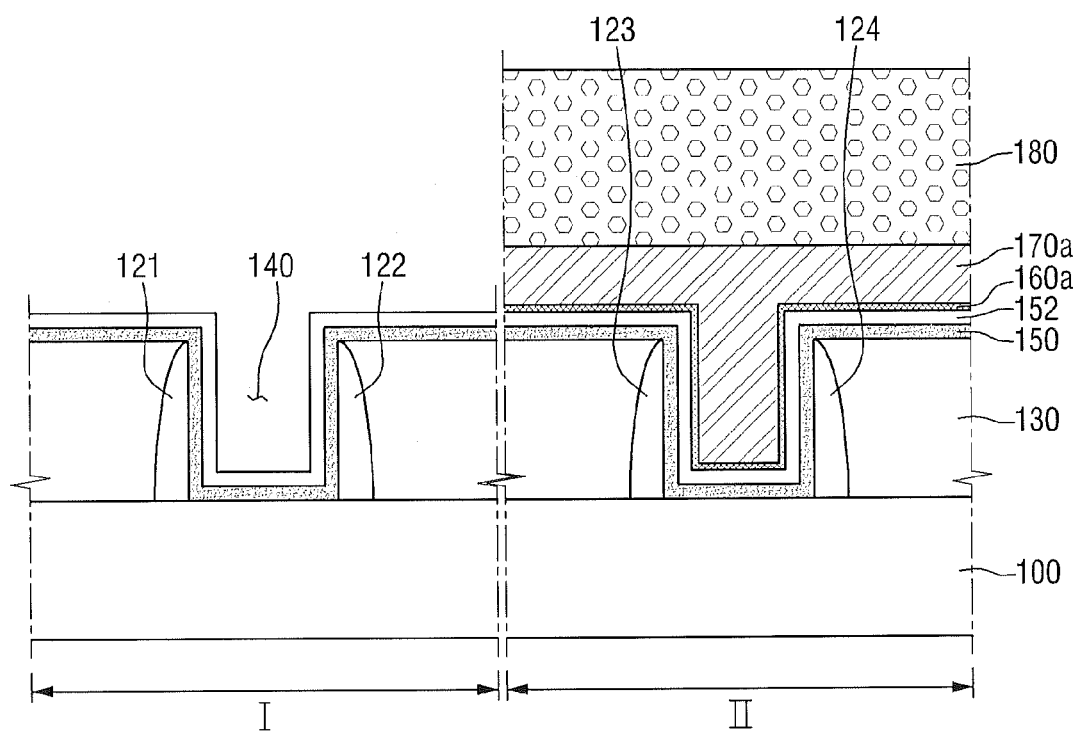
FIGS. 11 to 13 are cross-sectional views of intermediate structures of methods for manufacturing a semiconductor device according to some other embodiments of present inventive concepts.
Figure 12:
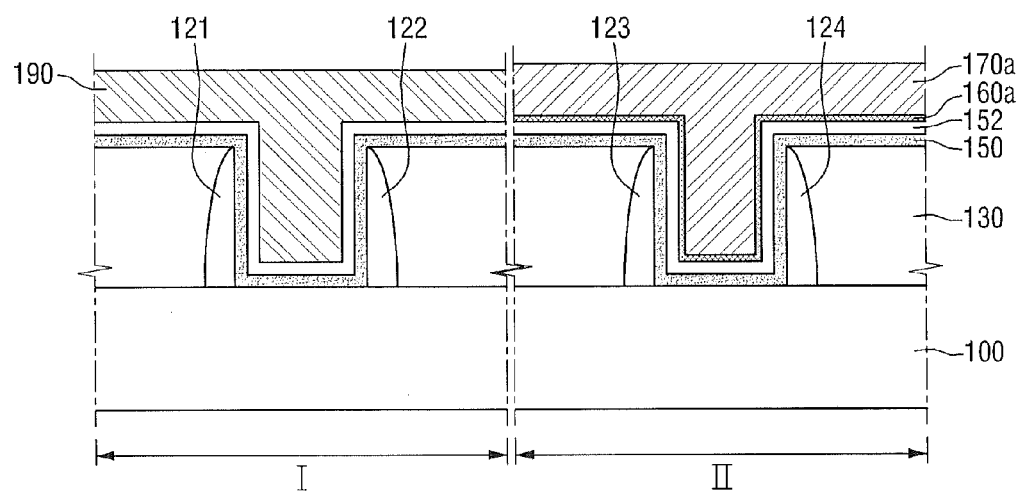
Figure 13:
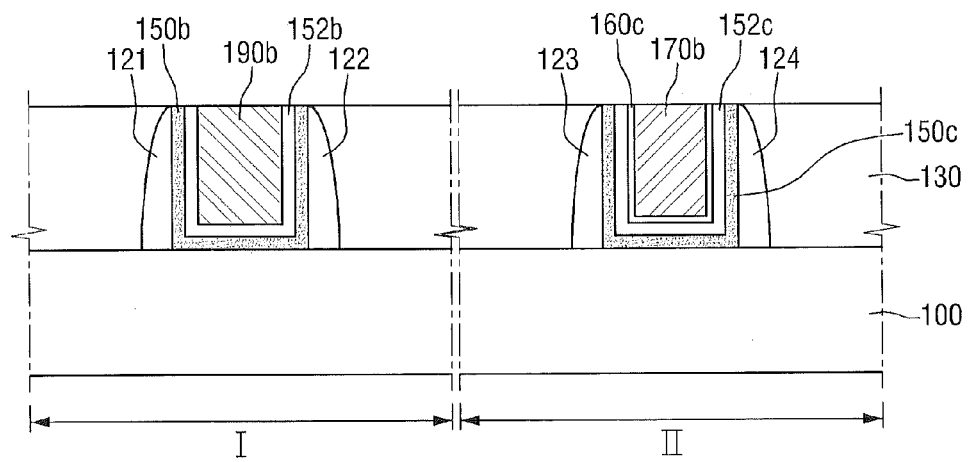

The method for manufacturing a semiconductor device according to other embodiments of present inventive concepts will now be described with reference to FIGS. 7, 8, and 11 to 13. The following description will focus on differences between the methods according to the present and previous embodiments of present inventive concepts. FIGS. 11 to 13 are cross-sectional views of intermediate structures illustrating the method for manufacturing a semiconductor device according to the other embodiments of present inventive concepts.

Methods for manufacturing a semiconductor device according to embodiments of present inventive concepts may further include removing an etch stop dielectric layer 160 in the first region I after removing a first metal layer 170 in a first region I.

Referring to FIG. 7, the first metal layer 170 is formed to fill first and second trenches (140 and 142 of FIG. 6). Referring to FIG. 8, the first metal layer 170 in the first region I may be removed using the etch stop dielectric layer 160 as an etch stopper, thereby forming the first trench 140.

Next, referring to FIG. 11, the etch stop dielectric layer 160 in the first region I may also be removed using the metal capping layer 152 in the first region I as an etch stopper. Consequently, the etch stop dielectric layer 160 in the first region I is removed while an etch stop dielectric layer pattern 160a in the second region II remains without being removed.

As a result of the process shown in FIG. 11, the first trench 140 may be enlarged by removing the etch stop dielectric layer 160 therein, compared to the first trench 140 shown in FIG. 8.

Next, referring to FIG. 12, a second metal layer 190 may be formed to fill the first trench (140 of FIG. 11). In detail, the mask layer (180 of FIG. 8) is removed, the second metal layer 190 may be formed on the first region I, and the first metal layer pattern 170a may be formed on the second region II. For example, a layer of the second metal may be found on the first region I (including trench 140) and on the second region II (including metal layer 170a), and the layer of the second metal may be selectively removed from the second region II.

Referring to FIG. 13, a top surface of the interlayer dielectric layer 130 may be exposed by planarizing the first metal layer pattern (170a of FIG. 12), the second metal layer (190 of FIG. 12), the gate dielectric layer (150 of FIG. 12), the metal capping layer (152 of FIG. 12) and the etch stop dielectric layer pattern (160a of FIG. 12).

Therefore, in the semiconductor device manufactured by the manufacturing method discussed above with respect to FIGS. 11-13, an etch stop dielectric layer pattern does not remain in the first region I but a second etch stop dielectric layer pattern 160c is maintained only in the second region II, unlike in the semiconductor device shown in FIG. 10.

Figure 14:
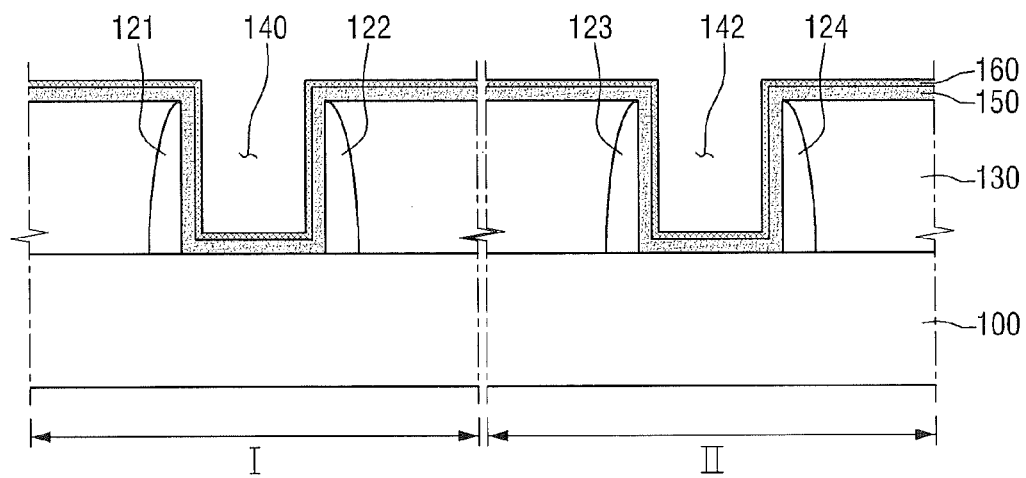
FIGS. 14 and 15 are cross-sectional views of intermediate structures of methods for manufacturing a semiconductor device according to still other embodiments of present inventive concepts.
Figure 15:
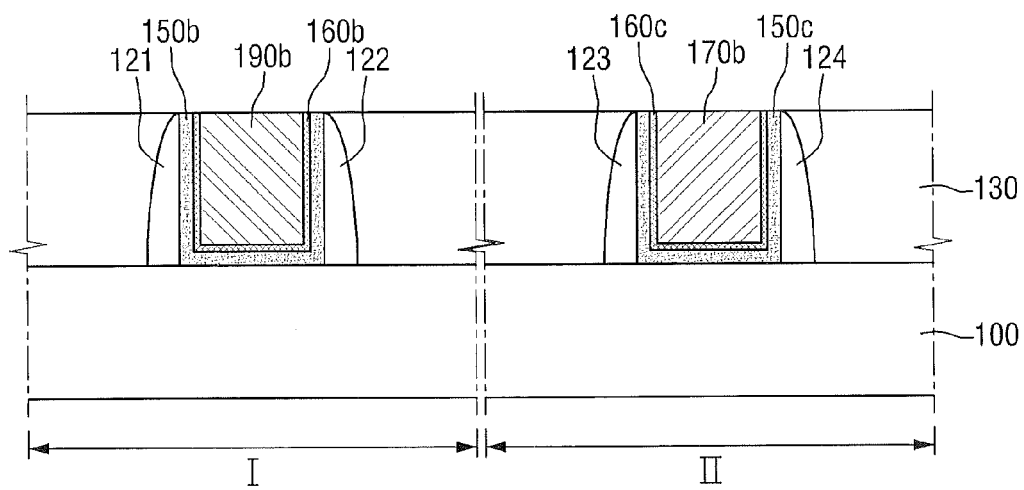

The method for manufacturing a semiconductor device according to still other embodiments of present inventive concepts will now be described with reference to FIGS. 4, 14 and 15. The following description will focus on differences between the methods according to the present and previous embodiments of present inventive concepts. FIGS. 14 and 15 are cross-sectional views of intermediate structures illustrating the method for manufacturing a semiconductor device according to still other embodiments of present inventive concepts.

In the method for manufacturing a semiconductor device according to embodiments of present inventive concepts, a metal capping layer is not formed on a gate dielectric layer 150 and an etch stop dielectric layer 160 may be formed to contact the gate dielectric layer 150.

Referring to FIG. 4, the first and second sacrificial gates (110 and 112 of FIG. 3) are removed to form the first and second trenches 140 and 142 in the first and second regions I and II, respectively.

Next, referring to FIG. 14, the gate dielectric layer 150 is conformally formed along a top surface of the interlayer dielectric layer 130, side and bottom surfaces of the first trench 140 and side and bottom surfaces of the second trench 142. Then, the etch stop dielectric layer 160 may be formed on the gate dielectric layer 150. Consequently, the etch stop dielectric layer 160 may be formed to contact the gate dielectric layer 150, and the metal capping layer 152 of FIGS. 5-13 may be omitted.

Therefore, referring to FIG. 15, in the semiconductor device manufactured by the manufacturing method according to embodiments of present inventive concepts, first and second metal capping layer patterns may not be formed in the first and second regions I and II, the first etch stop dielectric layer pattern 160b may be formed to directly contact the first gate dielectric layer pattern 150b, and the second etch stop dielectric layer pattern 160c may be formed to directly contact the second gate dielectric layer pattern 150c.

Figure 16:
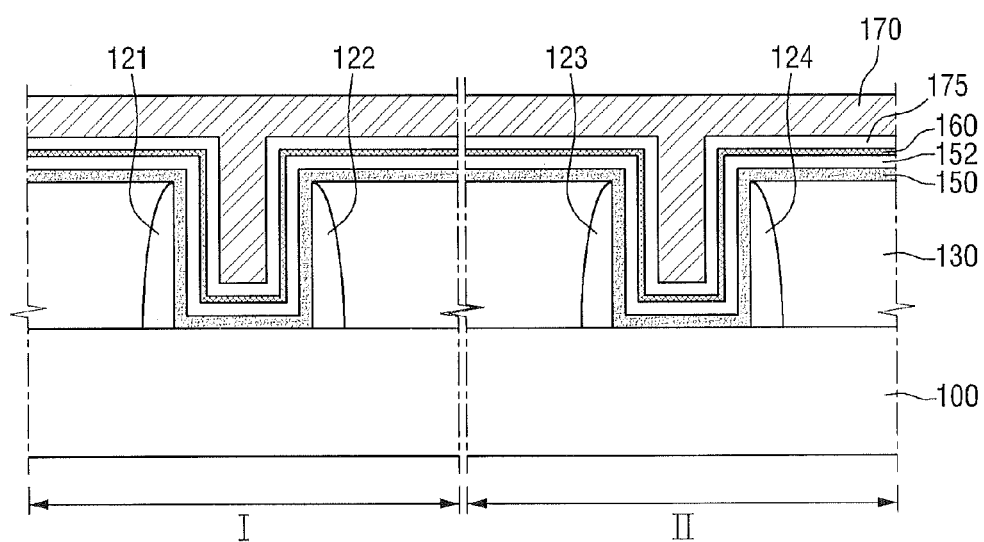
FIGS. 16 to 18 are cross-sectional views of intermediate structures of methods for manufacturing a semiconductor device according to yet other embodiments of present inventive concepts.
Figure 17:
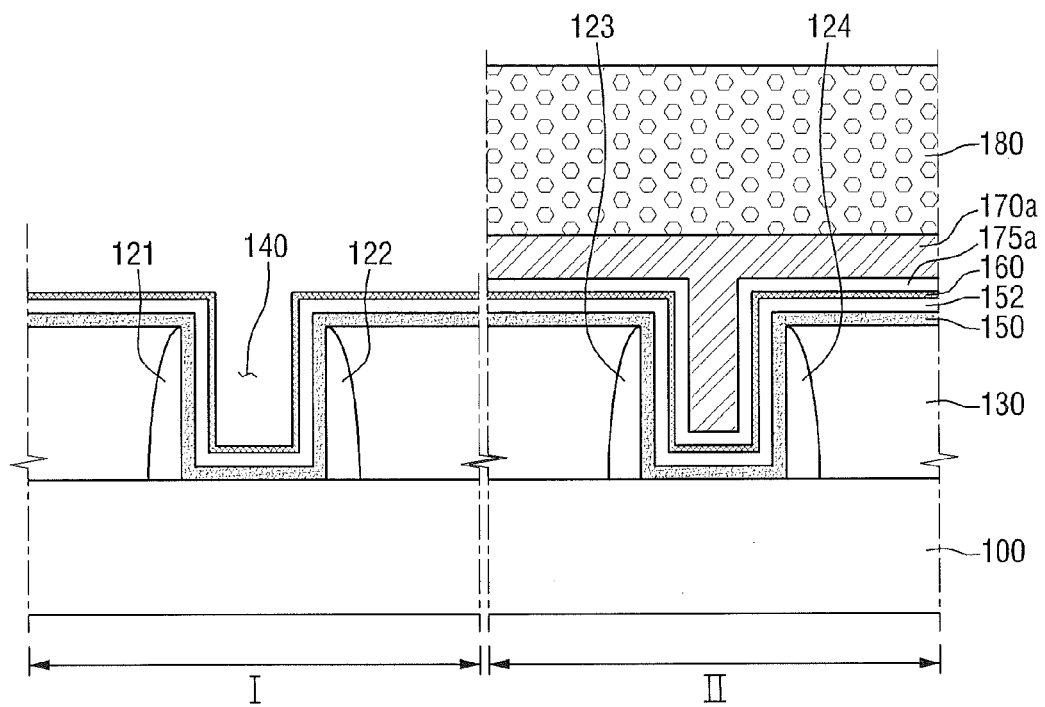
Figure 18:
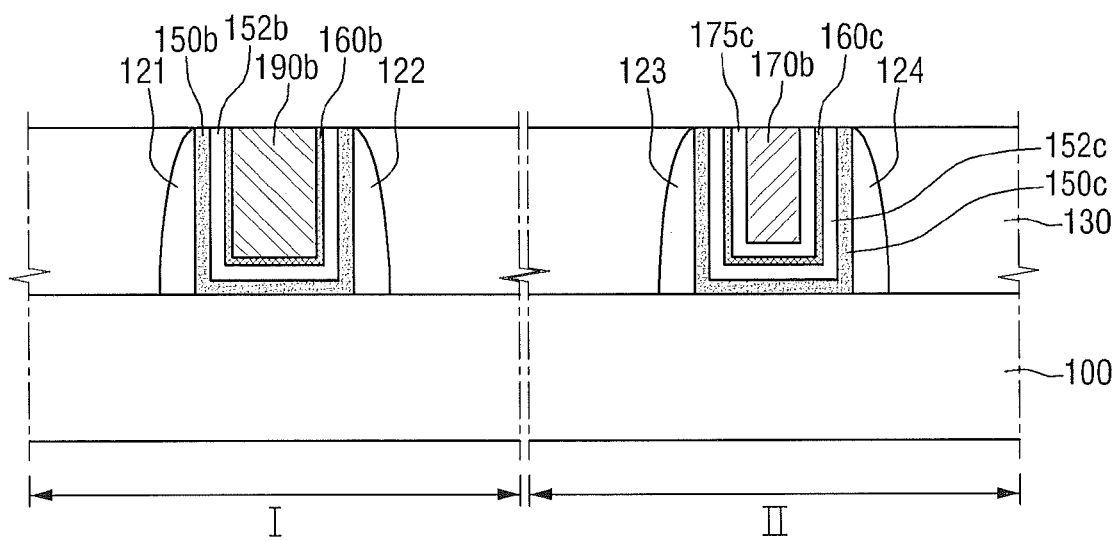

The method for manufacturing a semiconductor device according to yet other embodiments of present inventive concepts will now be described with reference to FIGS. 6 and 16 to 18. The following description will focus on differences between the methods according to the present and previous embodiments of present inventive concepts. FIGS. 16 to 18 are cross-sectional views of intermediate structures illustrating the method for manufacturing a semiconductor device according to yet other embodiments of present inventive concepts.

In the method for manufacturing a semiconductor device according to embodiments of present inventive concepts, a third metal layer 175, different from a first metal layer 170, may be formed between an etch stop dielectric layer 160 and the first metal layer 170.

Referring first to FIG. 6, a gate dielectric layer 150, a metal capping layer 152 and the etch stop dielectric layer 160 are sequentially formed along a top surface of an interlayer dielectric layer 130, side and bottom surfaces of a first trench 140 and side and bottom surfaces of a second trench 142.

Next, referring to FIG. 16, the third metal layer 175 may be conformally formed on the etch stop dielectric layer 160, and the first metal layer 170 may be formed to fill the first and second trenches (140 and 142 of FIG. 6). Consequently, the third metal layer 175 may be positioned between the etch stop dielectric layer 160 and the first metal layer 170. The third metal layer 175 may be, for example, a barrier layer.

Referring to FIG. 17, the first and third metal layers (170 and 175 FIG. 16) in the first region I may be removed using the etch stop dielectric layer 160 as an etch stopper.

In detail, a mask layer 180 may be formed on the first metal layer 170 in the second region II. In addition, the first and third metal layers 170 and 175 in the first region I are removed using the etch stop dielectric layer 160 as an etch stopper. While the first and third metal layers 170 and 175 in the first region I are etched, the first and third metal layers 170 and 175 in the second region II can be protected by the mask layer 180.

As a result of the process shown in FIG. 17, the first and third metal layers 170 and 175 in the first region I are removed to form a first trench 140, while the first and third metal layers 170 and 175 in the second region II, which are protected by the mask layer 180, remain to form first and third metal layer patterns 170a and 175a.

Therefore, referring to FIG. 18, in the semiconductor device manufactured by the manufacturing method according to embodiments of present inventive concepts, the third metal layer pattern 175c is formed in the second region II, unlike in the semiconductor device shown in FIG. 10. In detail, the third metal layer pattern 175c may be positioned between a second metal gate 170b and a second etch stop dielectric layer 160c.

While not shown in the figures for sake of brevity, first and second source/drain regions having a first conductivity type may be formed in substrate 100 on opposite sides of metal gate 190b, and third and fourth source/drain regions having a second conductivity type (different than the first conductivity type) may be formed in substrate 100 on opposite sides of metal gate 170b. Moreover, a first channel region between the first and second source drain regions may have the second conductivity type, and a second channel region between the third and fourth source/drain regions may have the first conductivity type to define complementary field effect transistors. The first, second, third, and fourth source/drain regions, for example, may be formed in substrate 100 by ion implantation before forming interlayer dielectric layer 130 using sacrificial gates 110/112 and/or spacers 121/122/123/124 as ion implant masks.

While present inventive concepts have been particularly shown and described with reference to exemplary embodiments thereof, it will be understood by those of ordinary skill in the art that various changes in form and details may be made therein without departing from the spirit and scope of present inventive concepts as defined by the following claims. It is therefore desired that the present embodiments be considered in all respects as illustrative and not restrictive, reference being made to the appended claims rather than the foregoing description to indicate the scope of inventive concepts.

What is claimed is:

1. A method for manufacturing a semiconductor device, the method comprising:
   providing a substrate having first and second regions;
   forming an interlayer dielectric layer on the substrate, wherein the interlayer dielectric layer includes a first trench on the first region of the substrate and a second trench on the second region of the substrate;
   forming a gate dielectric layer on a surface of the interlayer dielectric layer, on side and bottom surfaces of the first trench, and on side and bottom surfaces of the second trench;
   forming an etch stop dielectric layer on the gate dielectric layer, wherein the gate dielectric layer and the etch stop dielectric layer comprise different materials;
   forming a metal layer on the etch stop dielectric layer filling the first and second trenches; and
   removing the metal layer in the first region including the first trench using the etch stop dielectric layer as an etch stop.

2. The method of claim 1 wherein the gate dielectric layer comprises a high-k dielectric material, and wherein the etch stop dielectric layer comprises at least one selected from the group consisting of metal oxide, metal oxynitride, metal silicon oxide, and/or metal silicon oxynitride.

3. The method of claim 1 wherein forming the etch stop dielectric layer comprises depositing a metal capping layer on the gate dielectric layer and oxidizing the metal capping layer.

4. The method of claim 1 wherein removing the metal layer comprises selectively removing the metal layer in the first region including the first trench using the etch stop dielectric layer as an etch stop while maintaining the metal layer in the second region including the second trench.

5. The method of claim 1 further comprising:
   after removing the metal layer in the first region, removing the etch stop dielectric layer in the first region including the first trench.

6. The method of claim 5 wherein removing the etch stop dielectric layer comprises removing the etch stop dielectric layer in the first region including the first trench while maintaining the etch stop dielectric layer in the second region including the second trench.

7. The method of claim 1 further comprising:
   after forming the gate dielectric layer and before forming the etch stop dielectric layer, forming a metal capping layer on the gate dielectric layer so that the metal capping layer is between the gate dielectric layer and the etch stop dielectric layer.

8. The method of claim 1 wherein the metal layer comprises a first metal layer, the method further comprising:
   after forming the etch stop dielectric layer and before forming the first metal layer, forming a second metal layer on the etch stop dielectric layer so that the second metal layer is between the etch stop dielectric layer and the first metal layer wherein the first and second metal layers comprise different materials;
   wherein removing the metal layer comprise removing the first and second metal layers in the first region including the first trench using the etch stop dielectric layer as an etch stop.

9. The method of claim 1 wherein the metal layer comprises a first metal layer, the method further comprising:
   after removing the metal layer in the first region, forming a second metal layer filling the first trench in the first region wherein the first and second metal layers comprise different materials, and wherein the gate dielectric layer is between the second metal layer and the substrate.

10. The method of claim 9 wherein the first and second metal layers comprise different materials having different work functions.

11. The method of claim 1 further comprising:
    before forming the gate dielectric layer, providing first and second spacers at opposite sidewalls of the first trench and providing third and fourth spacers at opposite sidewalls of the second trench;
    wherein forming the gate dielectric layer comprises forming the gate dielectric layer on the first, second, third, and fourth spacers.

12. The method of claim 1 wherein one of the first and second regions is a PMOS region and the other of the first and second regions is an NMOS region.

13. The method of claim 1 wherein providing the substrate comprises providing the substrate having the first and second regions, providing first and second source/drain regions having a first conductivity type in the first region of the substrate on opposite sides of the first trench, providing a first channel region having a second conductivity type in the first region of the substrate between the first and second source/drain regions, providing third and fourth source/drain regions having the second conductivity type in the second region of the substrate on opposite sides of the second trench, providing a second channel region having the first conductivity type in the second region of the substrate between the third and fourth source/drain regions, wherein the first and second conductivity types are different.

14. The method of claim 1 wherein forming the interlayer dielectric layer comprises, forming a first sacrificial gate on the first region of the substrate, forming a second sacrificial gate on the second region of the substrate, forming a dielectric layer on the first and second sacrificial gates and on the first and second regions of the substrate, planarizing the dielectric layer to expose surfaces of the first and second sacrificial gates, and removing the first and second sacrificial gates to form the first and second trenches.

\* \* \* \* \*